(12) United States Patent
Ando et al.

(10) Patent No.: US 11,270,866 B2
(45) Date of Patent: Mar. 8, 2022

(54) ELECTRON BEAM INSPECTION APPARATUS AND ELECTRON BEAM INSPECTION METHOD

(71) Applicant: NuFlare Technology, Inc., Yokohama (JP)

(72) Inventors: Atsushi Ando, Edogawa-ku (JP); Takahiro Murata, Sagamihara (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 17/064,815

(22) Filed: Oct. 7, 2020

(65) Prior Publication Data
US 2021/0142978 A1 May 13, 2021

(30) Foreign Application Priority Data
Nov. 7, 2019 (JP) .............................. JP2019-201995

(51) Int. Cl.
*H01J 37/244* (2006.01)
*H01J 37/32* (2006.01)
*H01J 37/04* (2006.01)

(52) U.S. Cl.
CPC .......... *H01J 37/244* (2013.01); *H01J 37/045* (2013.01); *H01J 37/32532* (2013.01)

(58) Field of Classification Search
CPC ................... H01J 37/244; H01J 37/045; H01J 37/32532; H01J 2237/04756; H01J 37/20; H01J 37/228
See application file for complete search history.

(56) References Cited

U.S. PATENT DOCUMENTS

| 6,855,929 B2* | 2/2005 | Kimba | ................. G01N 23/225 250/307 |
| 9,236,223 B2* | 1/2016 | Nakayama | ............. B82Y 10/00 |
| 2006/0060781 A1* | 3/2006 | Watanabe | ............. B82Y 10/00 250/310 |

(Continued)

FOREIGN PATENT DOCUMENTS

| JP | 2010-33724 A | 2/2010 |
| JP | 2014-216183 A | 11/2014 |
| JP | 2019-54007 A | 4/2019 |

*Primary Examiner* — David A Vanore
(74) *Attorney, Agent, or Firm* — Oblon, McClelland, Maier & Neustadt, L.L.P.

(57) ABSTRACT

An electron beam inspection apparatus includes a plurality of electrodes to surround an inspection substrate placed on a stage, a camera to measure, for each of the plurality of electrodes, a gap between a peripheral edge of the inspection substrate and an electrode of the plurality of electrodes, a retarding potential application circuit to apply a retarding potential to the inspection substrate, an electrode potential application circuit to apply, to each electrode, a corresponding potential of potentials each obtained by adding an offset potential, which is variable according to a measured gap, to the retarding potential to be applied to the inspection substrate, and an electron optical system to irradiate the inspection substrate with electron beams, in the state where the retarding potential has been applied to the inspection substrate and the corresponding potential of the potentials has been individually applied to each of the plurality of electrodes.

10 Claims, 12 Drawing Sheets

(56) References Cited

U.S. PATENT DOCUMENTS

| | | | |
|---|---|---|---|
| 2007/0181808 A1* | 8/2007 | Murakoshi | H01J 37/29 250/310 |
| 2009/0014649 A1* | 1/2009 | Nakasuji | H01J 37/26 250/310 |
| 2021/0142978 A1* | 5/2021 | Ando | H01J 37/244 |
| 2021/0305009 A1* | 9/2021 | Raveh | H01J 37/153 |

* cited by examiner

Retarding Potential Vr

| Gap S (µm) | 300 | · · | 200 | · · · | 20 |
|---|---|---|---|---|---|
| Offset Potential (V) | -2.00 | · · · | -1.00 | · · · | -0.20 |

FIG.10

ELECTRON BEAM INSPECTION APPARATUS AND ELECTRON BEAM INSPECTION METHOD

CROSS-REFERENCE TO RELATED APPLICATION

This application is based upon and claims the benefit of priority from prior Japanese Patent Application No. 2019-201995 filed on Nov. 7, 2019 in Japan, the entire contents of which are incorporated herein by reference.

BACKGROUND OF THE INVENTION

Field of the Invention

Embodiments of the present invention relate to an electron beam inspection apparatus and an electron beam inspection method. For example, they relate to a method for inspecting a substrate with multiple electron beams.

Description of Related Art

With recent progress in high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as typified by 1 gigabit DRAMs (Dynamic Random Access Memories), the size of patterns which make up LSI is reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate.

As an inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there is "die-to-die inspection" or "die-to-database inspection". The "die-to-die inspection" method compares data of measured images acquired by imaging the same patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

In defect inspection of semiconductor wafers and photomasks, it is required to detect smaller size defects. Therefore, with respect to recent inspection apparatuses, specifically the pattern inspection apparatus described above, in addition to the type of apparatus that irradiates a substrate to be inspected (inspection substrate) with laser beams in order to obtain a transmission image or a reflection image of a pattern formed on the substrate, there has been developed another type of inspection apparatus that acquires a pattern image by scanning the inspection substrate with electron beams whose wavelength is shorter than that of laser lights, and detecting secondary electrons emitted from the inspection substrate due to the irradiation with the electron beams. With regards to the inspection apparatuses using electron beams, those using multiple beams have also been under development.

In the inspection apparatuses using electron beams including multiple beams, a retarding potential is applied to the inspection substrate in order to make a landing energy of the electron beams on the inspection substrate be in a suitable state. Thereby, for example, an electric field is formed between the objective lens and the inspection substrate. However, since the portion to which the retarding potential is applied ends at the peripheral edge of the inspection substrate, the electric field states are different when comparing the case of the inspection substrate center being irradiated with electron beams and the case of the peripheral portion being irradiated with them. Consequently, it results in that the trajectory of the electron beams deviates. Therefore, it has been devised to make the electric field states at the center and the peripheral portion of the inspection substrate uniform by disposing a peripheral ring which surrounds the substrate periphery and applying a retarding potential to the peripheral ring. However, there is a problem that the electric field is disturbed due to a gap (space) between the peripheral edge of the inspection substrate and the peripheral ring, and therefore, the irradiation position of the electron beams deviates at the peripheral portion of the inspection substrate. Thus, it becomes necessary to restrict the region to be inspected by excluding the peripheral portion where the irradiation position deviates.

Then, there is disclosed a method that a plurality of electric field correction substrates are disposed to surround the periphery of a target object, and their voltages are adjusted so that a mark formed on the target object can be correctly observed by viewing secondary electron images obtained through actual electron beam scanning of the target object with an applied retarding potential (e.g., refer to Japanese Patent Application Laid-open (JP-A) No. 2010-033724).

BRIEF SUMMARY OF THE INVENTION

According to one aspect of the present invention, an electron beam inspection apparatus includes a stage configured to mount an inspection substrate thereon, a plurality of electrodes arranged to surround the inspection substrate, a camera configured to measure, for each electrode of the plurality of electrodes, a gap between a peripheral edge of the inspection substrate and an electrode of the plurality of electrodes, a retarding potential application circuit configured to apply a retarding potential to the inspection substrate, an electrode potential application circuit configured to apply, to the each electrode, a corresponding potential of potentials each obtained by adding an offset potential, which is variable according to a measured gap, to the retarding potential to be applied to the inspection substrate, and an electron optical system configured to irradiate the inspection substrate with an electron beam, in a state where the retarding potential has been applied to the inspection substrate and the corresponding potential of the potentials each obtained by adding the offset potential to the retarding potential has been individually applied to the each electrode of the plurality of electrodes.

According to another aspect of the present invention, an electron beam inspection method includes measuring, for each electrode of a plurality of electrodes arranged to surround an inspection substrate mounted on a stage, a gap between a peripheral edge of the inspection substrate and an electrode of the plurality of electrodes, applying a retarding potential to the inspection substrate, applying, to the each electrode, a corresponding potential of potentials each obtained by adding an offset potential, which is variable according to a measured gap, to the retarding potential to be applied to the inspection substrate, irradiating the inspection substrate with an electron beam, in a state where the retarding potential has been applied to the inspection substrate and the corresponding potential of the potentials each obtained by adding the offset potential to the retarding potential has been individually applied to the each electrode of the plurality of electrodes, and comparing a measured image obtained by irradiation with the electron beam and a reference image corresponding to the measured image, and outputting a result of the comparing.

BRIEF DESCRIPTION OF THE DRAWINGS

FIG. 10 is an example of a correlation table showing a relation between a gap and an offset potential according to the first embodiment;

DETAILED DESCRIPTION OF THE INVENTION

The embodiments below describe an inspection apparatus and method that can reduce disturbance of the electric field at the peripheral portion of the substrate to be inspected.

The embodiments below describe an inspection apparatus using multiple beams, as an example of an electron beam inspection apparatus. Electron beams to irradiate the substrate may be a single beam or multiple beams.

First Embodiment

Figure 1:
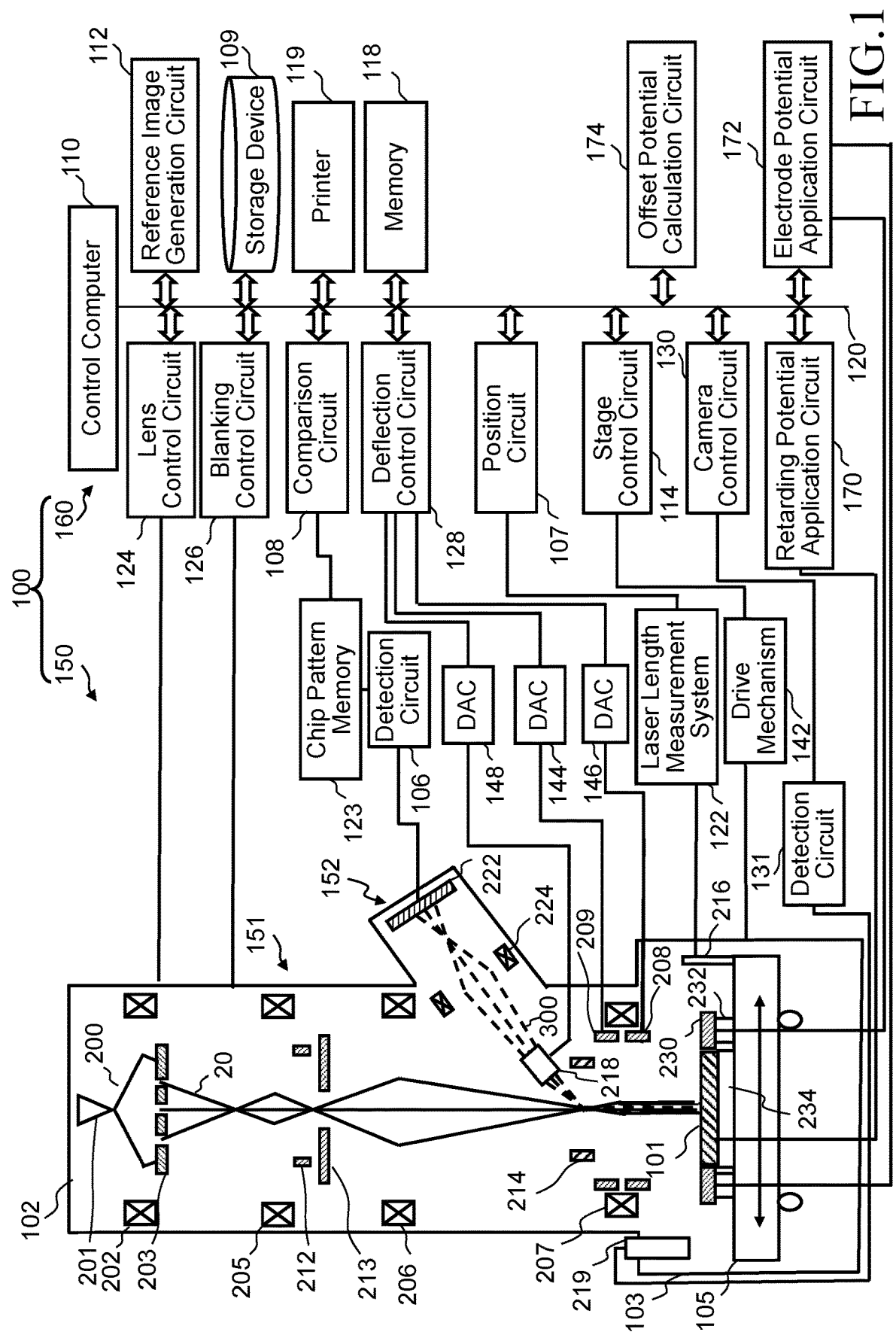
FIG. 1 shows a configuration of an inspection apparatus according to a first embodiment.

FIG. 1 shows a configuration of an inspection apparatus according to a first embodiment. In FIG. 1, an inspection apparatus 100 for inspecting a pattern formed on the substrate is an example of a multi electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a common blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, and a multi-detector 222. In the case of FIG. 1, a primary electron optical system 151 is composed of the electron gun 201, the electromagnetic lens 202, the shaping aperture array substrate 203, the electromagnetic lens 205, the common blanking deflector 212, the limiting aperture substrate 213, the electromagnetic lens 206, the electromagnetic lens 207 (objective lens), the main deflector 208, and the sub deflector 209. A secondary electron optical system 152 is composed of the electromagnetic lens 207, the beam separator 214, the deflector 218, and the electromagnetic lens 224.

In the inspection chamber 103, a stage 105 movable at least in the x and y directions is disposed. The substrate 101 (target object) to be inspected is mounted on the stage 105. The substrate 101 is placed on an electrostatic chuck mechanism 234 on the stage 105, and the backside of the substrate is absorbed by the electrostatic chuck. The substrate 101 may be an exposure mask substrate, or a semiconductor substrate such as a silicon wafer. In the case of the substrate 101 being a semiconductor substrate, a plurality of chips (wafer dies) are formed on the semiconductor substrate. In the case of the substrate 101 being an exposure mask substrate, a chip pattern is formed on the exposure mask substrate. The chip pattern is composed of a plurality of figure patterns. When the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the stage 105, for example. On the stage 105, there is disposed a mirror 216 which reflects a laser beam for measuring a laser length emitted from a laser length measuring system 122 arranged outside the inspection chamber 103.

Moreover, on the stage 105, a plurality of electrodes 230 are disposed to surround the substrate 101. The plurality of electrodes 230 are insulated from the stage 105 by an insulating spacer 232 on the stage 105, and adjusted such that the height position of the surface (top face) of each electrode 230 is substantially flush with the surface (top face) of the substrate 101. Preferably, the plurality of electrodes 230 are configured by a conductive material such as a metal exemplified by stainless. Alternatively, they are preferably configured such that the exposed plane surface of an insulating material such as ceramic is coated with a conductive material such as aluminum or titanium.

Within the inspection chamber 103, an optical camera 219 for imaging, from the above, the substrate 101 and the plurality of electrodes 230 on the stage 105 is disposed with its lens facing downward. As shown in the example of FIG. 1, a part of the optical camera 219 may be protruded outward from the inspection chamber 103. Preferably, a white LED (not shown) is used as an illumination of the optical camera 219. It is preferable that a CCD (Charged-coupled devices) camera is used as the optical camera 219. The optical camera 219 has a field of view on the order of mm square on the substrate 101, and has a resolution on the order of µm, for example. The optical camera 219 is connected to a detection circuit 131 at the outside of the inspection chamber 103.

The multi-detector 222 is connected, at the outside of the electron beam column 102, to a detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a camera control circuit 130, a retarding potential application circuit 170, an electrode potential application circuit 172 for applying potential to peripheral electrodes, an offset potential calculation circuit 174, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218. The detection circuit 131 is connected to the camera control circuit 130.

The substrate 101 is electrically connected to the retarding potential application circuit 170. The retarding potential application circuit 170 applies a negative retarding potential Vr to the substrate 101. The plurality of electrodes 230 are electrically connected to the electrode potential application circuit 172 for applying potential to peripheral electrodes. The electrode potential application circuit 172 individually applies a variable offset potential to each electrode 230.

The chip pattern memory 123 is connected to the comparison circuit 108. The stage 105 is driven by a drive mechanism 142 under the control of the stage control circuit 114. In the drive mechanism 142, a drive system such as a three (x-, y-, and θ-) axis motor which provides drive in the directions of x, y, and θ in the stage coordinate system is configured, and the stage 105 can move in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. In the stage coordinate system, the x, y, and θ directions are set with respect to a plane perpendicular to the optical axis of multiple primary electron beams 20, for example.

The electromagnetic lenses 202, 205, 206, 207 (objective lens), and 224, and the beam separator 214 are controlled by the lens control circuit 124. The common blanking deflector 212 is configured by two or more electrodes (or "two or more poles"), and each electrode is controlled by the blanking control circuit 126 through a DAC amplifier (not shown). The sub deflector 209 is configured by four or more electrodes (or "four or more poles"), and each electrode is controlled by the deflection control circuit 128 through the DAC amplifier 144. The main deflector 208 is configured by four or more electrodes (or "four or more poles"), and each electrode is controlled by the deflection control circuit 128 through the DAC amplifier 146. The deflector 218 is configured by four or more electrodes (or "four or more poles"), and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
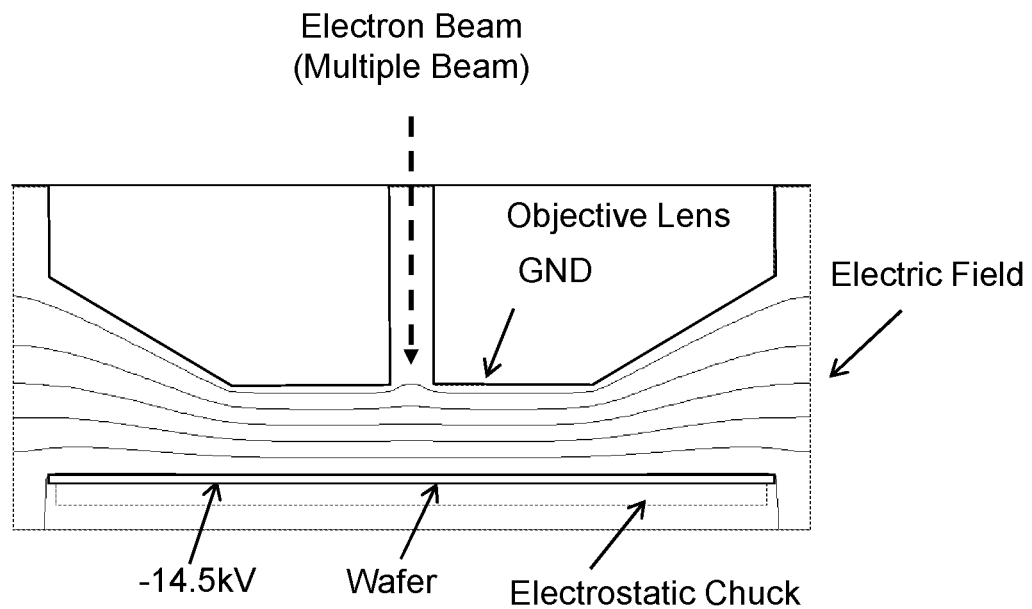
FIG. 2 shows an example of an electric field in the case of the central part of a target object surface being irradiated with electron beams, according to a comparative example 1 of the first embodiment.

FIG. 2 shows an example of an electric field in the case of the central part of a target object surface being irradiated with electron beams, according to a comparative example 1 of the first embodiment.

Figure 3:
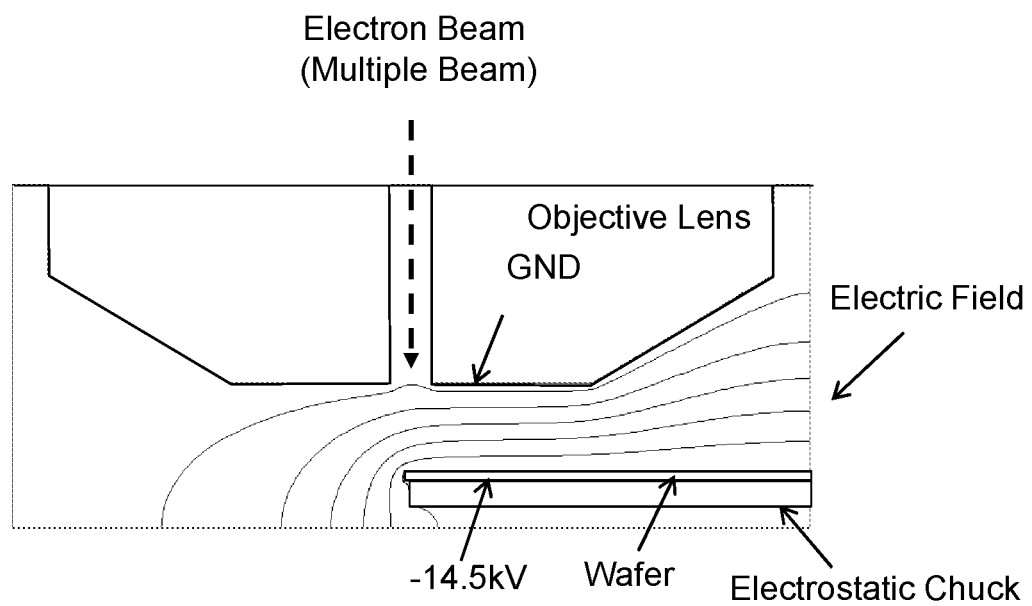
FIG. 3 shows an example of an electric field in the case of an edge portion of a target object surface being irradiated with electron beams, according to the comparative example 1 of the first embodiment.

FIG. 3 shows an example of an electric field in the case of an edge portion of the target object surface being irradiated with electron beams, according to the comparative example 1 of the first embodiment. The comparative example 1 of FIGS. 2 and 3 shows the state where a retarding potential of, for example, −14.5 kV is applied to a wafer used as the target object, and a ground potential (GND) is applied to the objective lens above the wafer. Thereby, an electric field is formed between the objective lens and the wafer, for example. It turns out that the electric field state in the case of the wafer central portion being irradiated with electron beams shown in FIG. 2 differs from that in the case of the wafer peripheral portion being irradiated with electron beams shown in FIG. 3. This is caused by that the portion to which the retarding potential is applied ends at the peripheral edge of the wafer. As a result, the trajectory of the electron beams in the case of the wafer central portion being irradiated with electron beams shown in FIG. 2 deviates from that in the case of the wafer peripheral portion being irradiated with them shown in FIG. 3.

Figure 4:
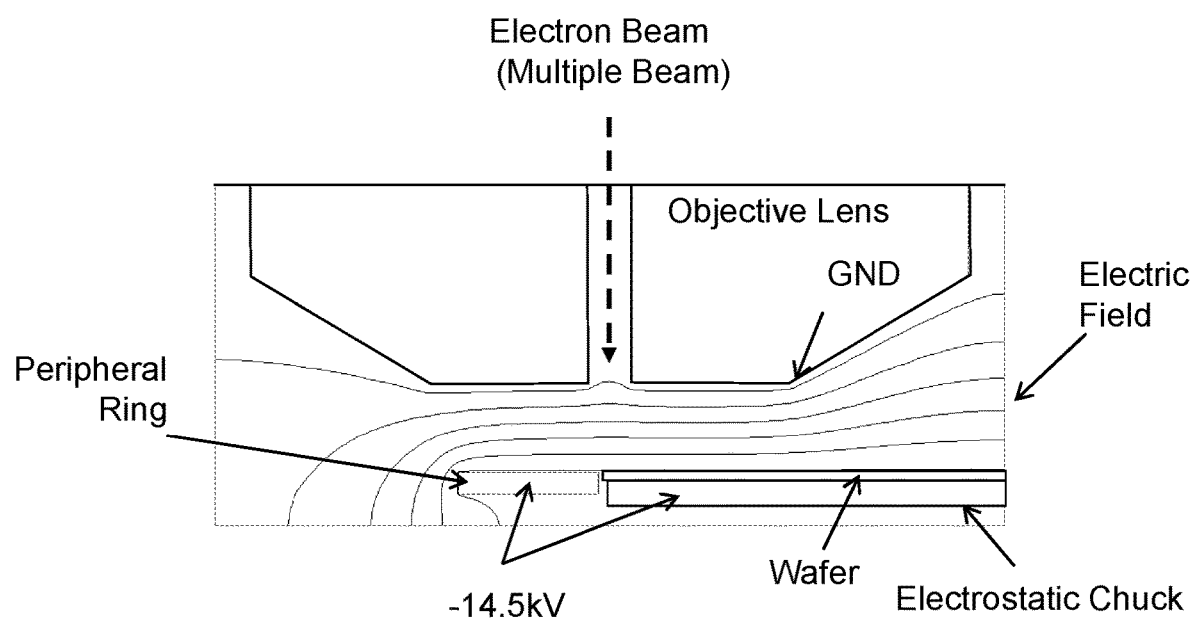
FIG. 4 shows an example of an electric field in the case of an edge portion of a target object surface being irradiated with electron beams, according to a comparative example 2 of the first embodiment.

FIG. 4 shows an example of an electric field in the case of an edge portion of the target object surface being irradiated with electron beams, according to a comparative example 2 of the first embodiment.

Figure 5:
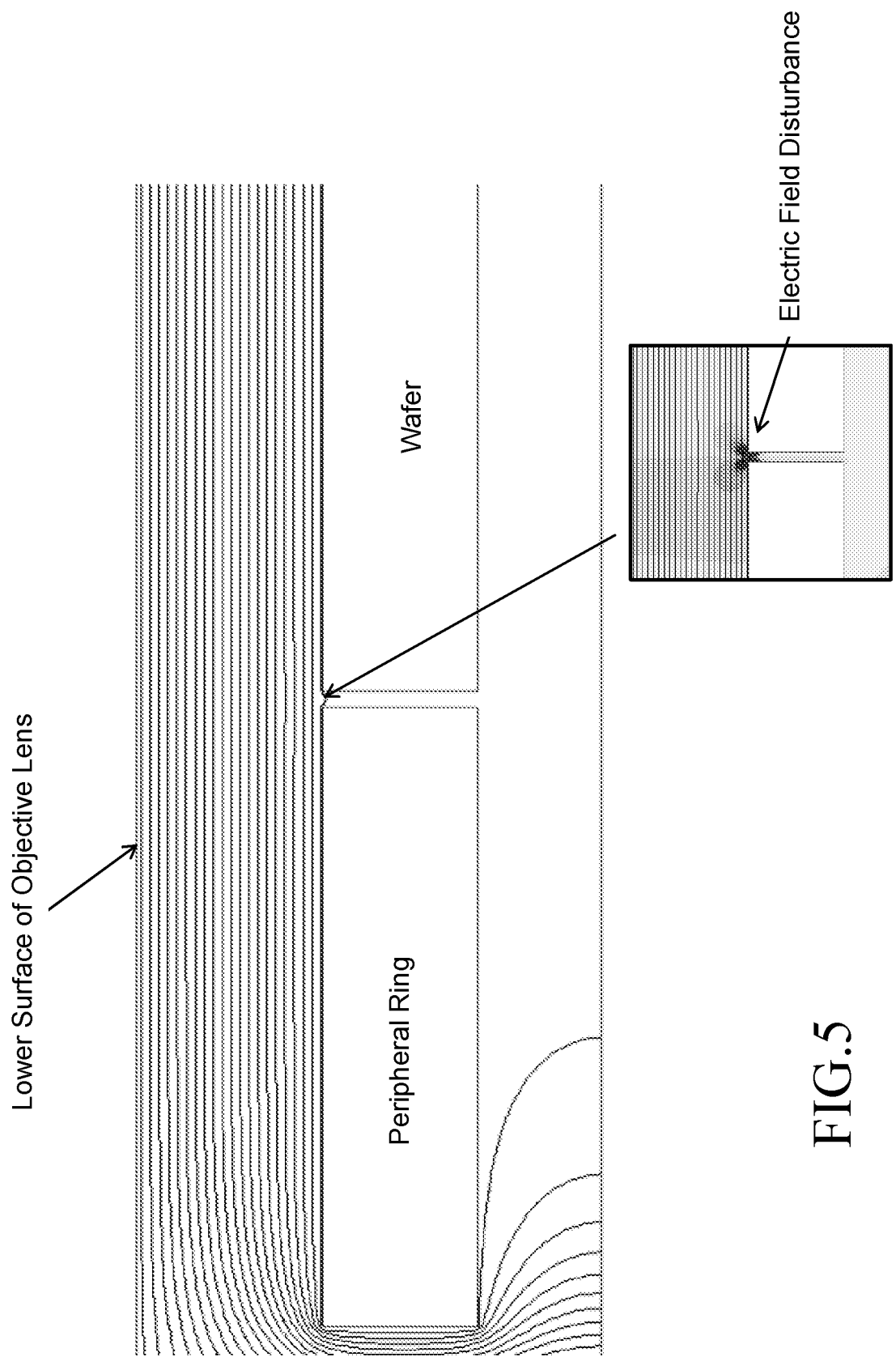
FIG. 5 shows an enlarged view of an example of an electric field at a region between an edge portion of a target object and a peripheral ring, according to the comparative example 2 of the first embodiment.

FIG. 5 shows an enlarged view of an example of an electric field at the region between an edge portion of the target object and a peripheral ring according to the comparative example 2 of the first embodiment. The comparative example 2 of FIG. 4 shows the case where the peripheral ring surrounds the periphery of the wafer. Then, a retarding potential being the same as that applied to the wafer is applied to the peripheral ring. Thereby, it seemingly appears the same electric field as that in the case of the wafer center portion being irradiated with electron beams shown in FIG. 2 is also obtained even when the wafer peripheral portion is irradiated with electron beams. However, as shown in FIG. 5, the electric field is disturbed due to a gap (space) between the peripheral edge of the wafer and the peripheral ring, and therefore, deviation of the irradiation position of electron beams occurs at the wafer peripheral portion. In particular, when an acceleration voltage and a retarding potential are made to be high so as to obtain a high resolution, the disturbance of the electric field becomes noticeable.

Figure 6:
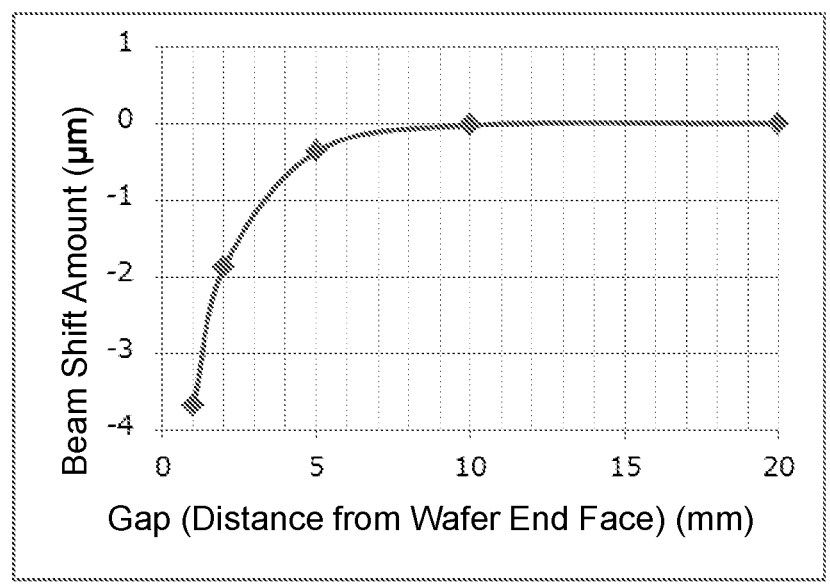
FIG. 6 shows a measurement result example of amount of deviation (shift) of an electron beam irradiation position with respect to a distance on the substrate from the substrate peripheral edge, according to the comparative example 2 of the first embodiment.

FIG. 6 shows a measurement result example of amount of deviation (shift) of an electron beam irradiation position with respect to a distance on the substrate from the substrate peripheral edge according to the comparative example 2 of the first embodiment. In the example of FIG. 6, a peripheral ring is arranged having a gap (space) of 500 μm to the periphery of the wafer. Then, in the state where a retarding potential being the same as that applied to the wafer is applied to the peripheral ring, the amount of deviation (the amount of beam shift) of the irradiation position is measured while shifting the position to be irradiated by an electron beam from the wafer peripheral edge toward the wafer center. In the case of FIG. 6, the width of the peripheral ring is set to be 25 mm, for example. It turns out that when there is a gap of 500 μm, the closer to the wafer peripheral edge the position is, the larger the irradiation position deviation of electron beams is. Moreover, it turns out that the influence of the gap of 500 μm can be avoided at the position shifted to some extent (10 mm in the case of FIG. 6) or more from the wafer peripheral edge toward the wafer center. Although the 500 μm gap is set in FIG. 6, it has been known that if the size of the gap is changed, the amount of beam shift at each position also changes according to the gap size. Then, according to the first embodiment, focusing attention on the gap between the peripheral edge of a substrate and an electrode at the peripheral side, deviation of the irradiation position of electron beams at the peripheral portion of the substrate is to be reduced.

Figure 7:
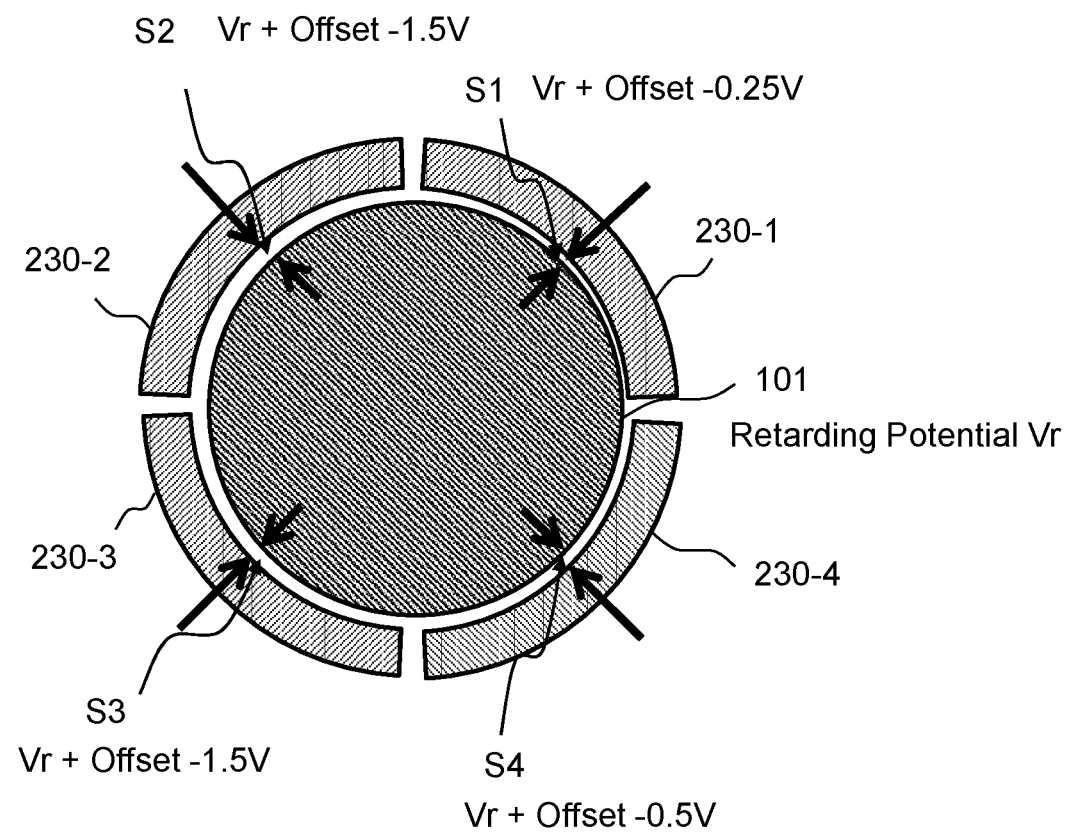
FIG. 7 shows an example of an arrangement state of a substrate and a plurality of electrodes at the peripheral side, according to the first embodiment.

FIG. 7 shows an example of an arrangement state of a substrate and a plurality of electrodes at the peripheral side according to the first embodiment. As shown in FIG. 7, a plurality of electrodes 230 are arranged to surround the circumference of the substrate 101. The example of FIG. 7 shows the case where the substrate 101 is surrounded by four electrodes 230-1 to 230-4. In the case of FIG. 7, the plurality of electrodes 230 which are obtained by dividing the peripheral ring into, for example, four are arranged. The shape is not limited thereto. It is preferable that the peripheral edges of the plurality of electrodes 230 on the side of the inspection substrate are formed in the shape of an arc in accordance with the peripheral shape of the substrate 101. Preferably, the curvature radius of the peripheral edge of each of the plurality of electrodes 230 at the inspection substrate side is formed to be a little larger than the radius of the substrate 101. For example, the curvature radius is preferably larger than the radius of the substrate 101 by about 100 μm. However, it is not limited thereto. What is necessary for the curvature radius is to be the size where the substrate 101 can be arranged according to the arrangement accuracy of the substrate 101 in the transfer system. On the other hand, the peripheral edge of the plurality of electrodes 230 at the opposite side to the inspection substrate does not need to be formed in the shape of an arc. According to the first embodiment, deviation of the irradiation position of electron beams which occurs when the same retarding potential Vr as that applied to the substrate 101 is applied to the plurality of electrodes 230 is reduced by further adding an offset potential $\Delta V$ to the plurality of electrodes 230. With regard to a gap (space) between the electrodes 230, it is formed such that a potential applied to each electrode 230 is not affected by other electrodes.

Figure 8:
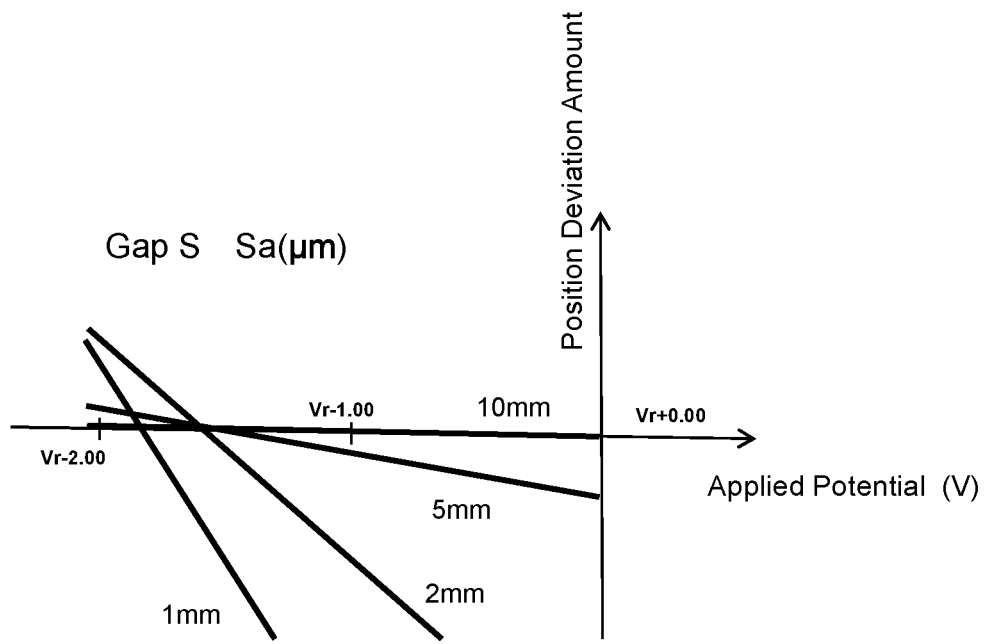
FIG. 8 shows a relation between an offset potential and an amount of beam shift at each position in the case of a gap S between the substrate and the electrode at the peripheral side of the substrate being Sa, according to the first embodiment.

FIG. 8 shows a relation between an offset potential and an amount of beam shift at each position in the case of a gap S between the substrate and the electrode at the peripheral side of the substrate being Sa according to the first embodiment. In FIG. 8, the ordinate axis represents an amount of positional deviation (amount of beam shift) of the irradiation position of an electron beam, and the abscissa axis represents a potential applied to an electrode at the peripheral side. The potential shown on the abscissa axis is a value obtained by adding a negative offset potential $\Delta V$ to a retarding potential Vr (e.g., −14.5 kV) being the same as that applied to the substrate 101. In the case of FIG. 8, the gap S between the substrate 101 and the electrode at the peripheral side 230 is Sa (e.g., 250 μm). The example of FIG. 8 shows that the beam shift amount is zero if a negative offset potential $\Delta V$ of about −1.75 V is added to the retarding potential Vr when an electron beam irradiates the position shifted from the peripheral edge of the substrate 101 toward the center by 1 mm on the substrate. It is shown that the beam shift direction reverses at the negative offset potential $\Delta V$ of about −1.75 V, and the beam shift amount increases as it becomes distant from about −1.75 V. Moreover, the example of FIG. 8 shows that the beam shift amount is zero if a negative offset potential $\Delta V$ of about −1.5 V is added to the retarding potential Vr when an electron beam irradiates the position shifted from the peripheral edge of the substrate 101 toward the center by 2 mm or 5 mm on the substrate. It is also shown in the example of FIG. 8 that the beam shift amount is substantially zero at the position shifted from the peripheral edge of the substrate 101 toward the center by 10 mm on the substrate regardless of the retarding potential Vr.

Figure 9:
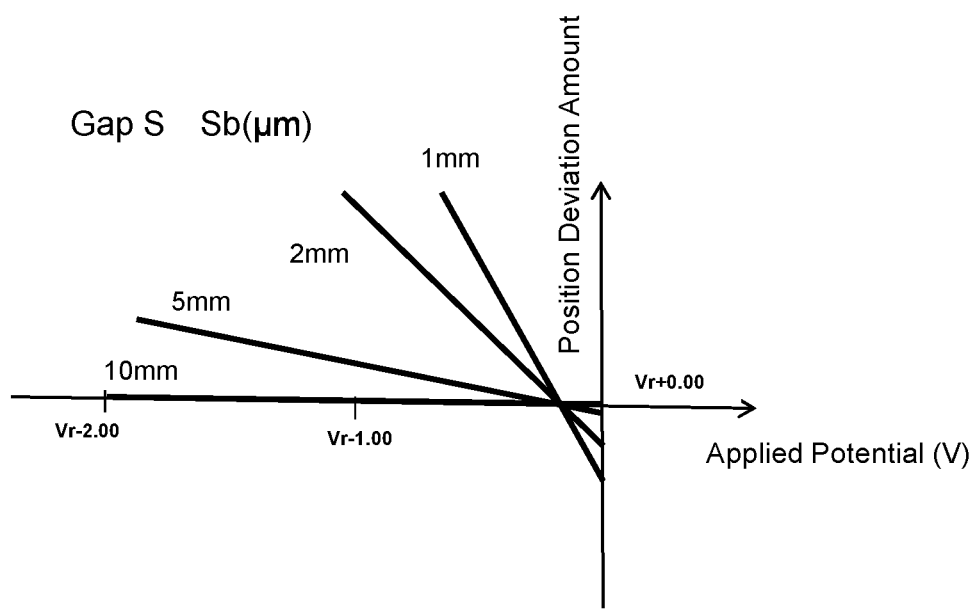
FIG. 9 shows a relation between an offset potential and an amount of beam shift at each position in the case of a gap S between the substrate and the electrode at the peripheral side of the substrate being Sb, according to the first embodiment.

FIG. 9 shows a relation between an offset potential and an amount of beam shift at each position in the case of a gap S between the substrate and the electrode at the peripheral side of the substrate being Sb according to the first embodiment. In FIG. 9, under the condition of the gap Sb (e.g., 25 μm) being different from the gap Sa of FIG. 8, the ordinate axis represents an amount of positional deviation (amount of beam shift) of the irradiation position of an electron beam, and the abscissa axis represents a potential applied to an electrode at the peripheral side. The potential shown on the abscissa axis is a value obtained by adding a negative offset potential $\Delta V$ to a retarding potential Vr being the same as that applied to the substrate 101. The example of FIG. 9 shows that the beam shift amount is zero if a negative offset potential $\Delta V$ of about −0.25 V is added to the retarding potential Vr at the position shifted from the peripheral edge of the substrate 101 toward the center by 1 mm, 2 mm, or 5 mm on the substrate. It is also shown in the example of FIG. 9 that the beam shift amount is substantially zero at the position shifted from the peripheral edge of the substrate 101 toward the center by 10 mm on the substrate regardless of the retarding potential Vr.

As shown in FIGS. 8 and 9, if the size of the gap S changes, the amount of a negative offset potential necessary for bringing the beam shift amount close to zero also changes. However, when the substrate 101 is transferred onto the stage 105, there may be an error in the reproducibility of the position where the substrate 101 is to be placed by the transfer system. That is, the gap S is not necessarily uniform around the circumference of the peripheral edge of the substrate 101. Then, according to the first embodiment, daringly, instead of using one peripheral ring, a plurality of electrodes 230 obtained by quartering, for example, are disposed as shown in FIG. 7. Thereby, according to the gap S between the substrate 101 and the electrode 230, which is generated after disposing the substrate 101, the offset potential at each position can be variably controlled.

FIG. 10 is an example of a correlation table showing a relation between a gap and an offset potential according to the first embodiment. In the example of the correlation table of FIG. 10, the gap S between the substrate 101 and the electrode 230 at the peripheral side of the substrate 101 is set to be variable. With respect to each gap S, an optimized offset potential is defined that makes as small as possible the amount of beam shift at each of the positions shifted from the peripheral edge of the substrate 101 toward the center by, for example, 1 mm, 2 mm, 5 mm, and 10 mm on the substrate in the state in which a retarding potential Vr is preset to the substrate 101 and each electrode 230. Such a correlation table should be generated in advance by experiment, etc. The generated correlation table may be stored in the storage device 109. If it is difficult to make the amounts of beam shift substantially zero at all the positions shifted by 1 mm, 2 mm, 5 mm and 10 mm on the substrate, another offset potential should be defined that makes the amount of beam shift substantially zero at each of the positions shifted by 2 mm, 5 mm and 10 mm on the substrate. If it is still difficult to define such an offset potential, another offset potential that makes the amount of beam shift substantially zero at each of the positions shifted by 5 mm and 10 mm on the substrate should be defined. It is preferable to define an offset potential which can make the amount of beam shift small and can last the smallness up to the position close as much as possible to the peripheral edge of the substrate 101.

Now, an inspection method according to the first embodiment is described.

In a gap measurement step, after the substrate 101 is arranged on the stage 105, the optical camera 219 measures a gap S between the peripheral edge of the inspection substrate 101 and the electrode 230 concerned, for each of a plurality of electrodes 230 disposed to surround the inspection substrate 101 placed on the stage 105. Specifically, it operates as follows: First, the stage 105 is moved so that the gap between a selected electrode 230 and the substrate 101 may be in the field of view of the optical camera 219. For example, the measuring position is preferably close to the center position of the arc edge portion on the side of the substrate 101 of the electrode 230. The camera control circuit 130 images, for each selected electrode 230, a selected gap S with the optical camera 219. Data of the captured image is output to the detection circuit 131. In the detection circuit 131, detected data in analog form is converted into digital data by an A-D converter (not shown), and then, the digital data is output to the camera control circuit 130. The camera control circuit 130 measures the gap S based on the imaged data. The measured result is output to the offset potential calculation circuit 174.

In an offset potential calculating step, referring to the correlation table stored in the storage device 109, the offset potential calculation circuit 174 calculates, for each electrode 230, an offset potential in accordance with the size of the gap S. In the case of the measured gap S being a mean value of a plurality of gaps defined in the correlation table, an offset potential may be calculated by linear interpolation. The calculated offset potential is output to the electrode potential application circuit 172 for applying potential to peripheral electrodes.

In a retarding potential applying step, the retarding potential application circuit 170 (retarding potential application unit) applies a retarding potential Vr to the inspection substrate 101.

In a step for applying potential to peripheral electrodes, the electrode potential application circuit 172 for applying potential to peripheral electrodes (that is, a unit for applying potential to electrodes) applies to each electrode 230 concerned a potential obtained by adding an offset potential $\Delta V$ which is variable according to a measured gap S to a retarding potential Vr to be applied to the inspection substrate 101.

Figure 11:
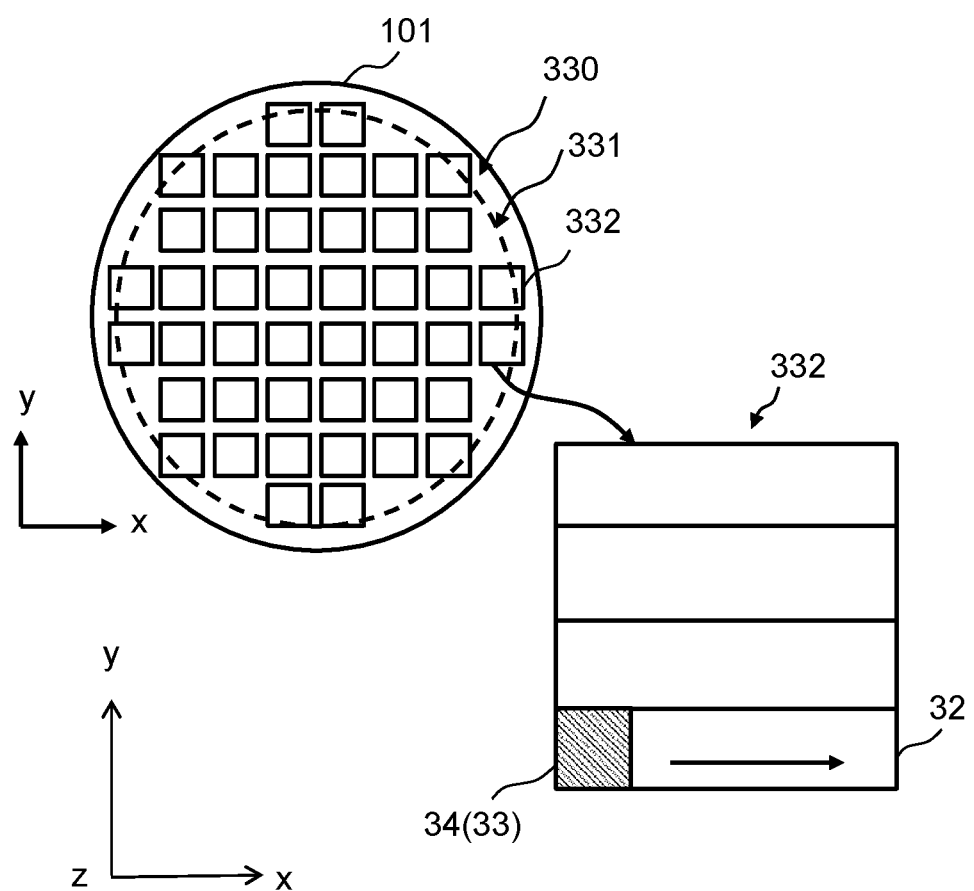
FIG. 11 shows an example of a plurality of chip regions formed on a semiconductor substrate according to the first embodiment.

In a scanning step, in the state where a retarding potential Vr has been applied to the inspection substrate 101 and a potential obtained by adding a variable offset potential $\Delta V$ to the retarding potential Vr has been applied to a plurality of electrodes 230, the primary electron optical system irradiates the inspection substrate 101 with electron beams (multiple primary electron beams 20). In other words, the image acquisition mechanism 150 acquires a secondary electron image of a pattern formed on the inspection substrate 101, using the multiple primary electron beams 20. Specifically, it operates as follows:

FIG. 11 shows an example of a plurality of chip regions formed on a semiconductor substrate according to the first embodiment. In FIG. 11, in the case of the substrate 101 being a semiconductor substrate (wafer), a plurality of chips (wafer dies) 332 in a two-dimensional array are formed in an inspection region 330 of the semiconductor substrate (wafer). A mask pattern for one chip formed on an exposure mask substrate is reduced to, for example, ¼, and exposed/transferred onto each chip 332 by an exposure device (stepper) (not shown). Generally, a mask pattern for one chip is formed by a plurality of figure patterns. For example, the region of each chip 332 is divided in the y direction into a plurality of stripe regions 32 by a predetermined width. The scanning operation by the image acquisition mechanism 150 is carried out for each stripe region 32, for example. The operation of scanning the stripe region 32 advances relatively in the x direction while the stage 105 is moved in the −x direction, for example. Each stripe region 32 is divided in the longitudinal direction into a plurality of rectangular (including square) regions 33. Beam application to a target rectangular region 33 is achieved by collectively deflecting all the multiple primary electron beams 20 by the main deflector 208.

Figure 12:
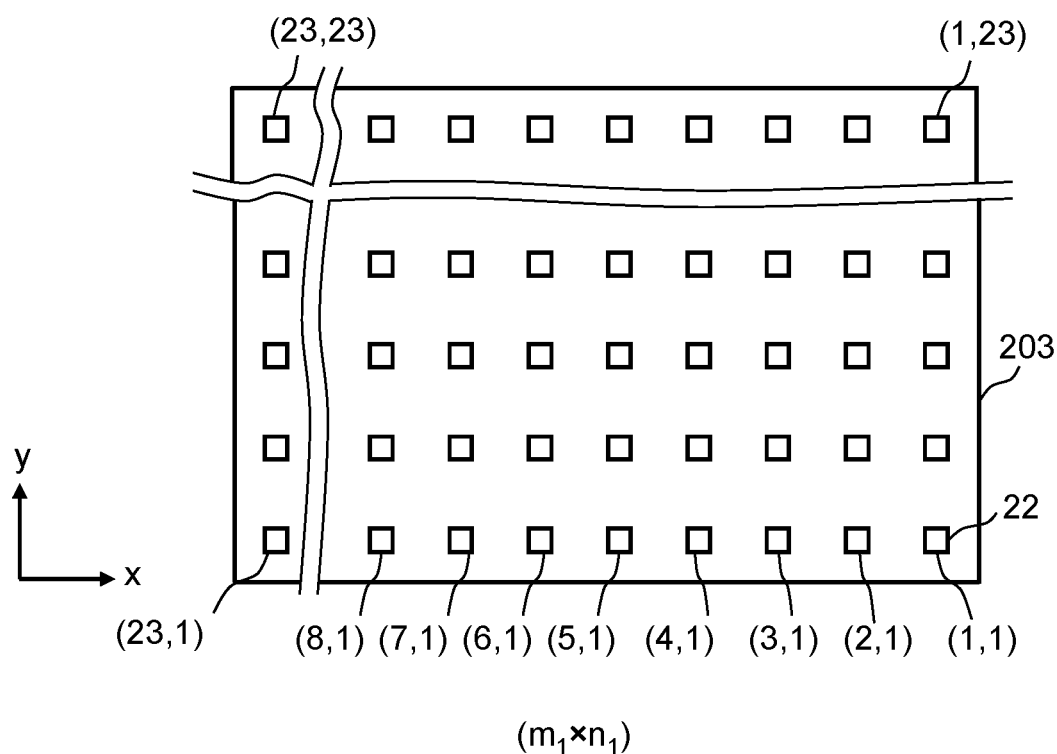
FIG. 12 is a conceptual diagram showing a configuration of a shaping aperture array substrate according to the first embodiment.

FIG. 12 is a conceptual diagram showing a configuration of a shaping aperture array substrate according to the first embodiment. As shown in FIG. 12, holes (openings) 22 of $m_1$ columns wide (width in the x direction) (each column in the y direction) and $n_1$ rows long (length in the y direction) (each row in the x direction) are two-dimensionally formed in the x and y directions at a predetermined arrangement pitch in the shaping aperture array substrate 203, where each of $m_1$ and $n_1$ is an integer of 2 or more. In the case of FIG. 6, 23×23 holes (openings) 22 are formed. Each of the holes 22 is a rectangle (including a square) having the same dimension, shape, and size. Alternatively, each of the holes 22 may be a circle with the same outer diameter. The multiple primary electron beams 20 are formed by letting portions of the electron beam 200 individually pass through a corresponding one of the plurality of holes 22. Next, operations of the image acquisition mechanism 150 in the case of acquiring a secondary electron image are described.

The electron beam 200 emitted from the electron gun 201 (emission source) is refracted by the electromagnetic lens 202, and illuminates the whole of the shaping aperture array substrate 203. As shown in FIG. 12, a plurality of holes (openings) are formed in the shaping aperture array substrate 203. The region including all the plurality of holes 22 is irradiated by the electron beam 200. The multiple primary electron beams 20 are formed by letting portions of the electron beam 200, which irradiate the positions of the plurality of holes 22, individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens), while repeating forming an intermediate image and a crossover, through the beam separator 214 arranged on the intermediate image plane (position conjugate to the image plane) of each beam of the multiple primary electron beams 20.

When the multiple primary electron beams 20 are incident on the electromagnetic lens 207 (objective lens), the electromagnetic lens 207 focuses the multiple primary electron beams 20 onto the substrate 101. The multiple primary electron beams 20 having been focused on the substrate 101 (target object) by the objective lens 207 are collectively deflected by the main deflector 208 and the sub deflector 209 so as to irradiate respective beam irradiation positions on the substrate 101. When all of the multiple primary electron beams 20 are collectively deflected by the common blanking deflector 212, they deviate from the hole in the center of the limiting aperture substrate 213 and are blocked by the limiting aperture substrate 213. On the other hand, the multiple primary electron beams 20 which were not deflected by the common blanking deflector 212 pass through the hole in the center of the limiting aperture substrate 213 as shown in FIG. 1. Blanking control is provided by On/Off of the common blanking deflector 212 to collectively control On/Off of the multiple beams. Thus, the limiting aperture substrate 213 blocks the multiple primary electron beams 20 which were deflected to be in the "Off condition" by the common blanking deflector 212. Then, the multiple primary electron beams 20 for image acquisition are formed by beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons each corresponding to each of the multiple primary electron beams 20 is emitted from the substrate 101 due to the irradiation by the multiple primary electron beams 20.

Figure 13:
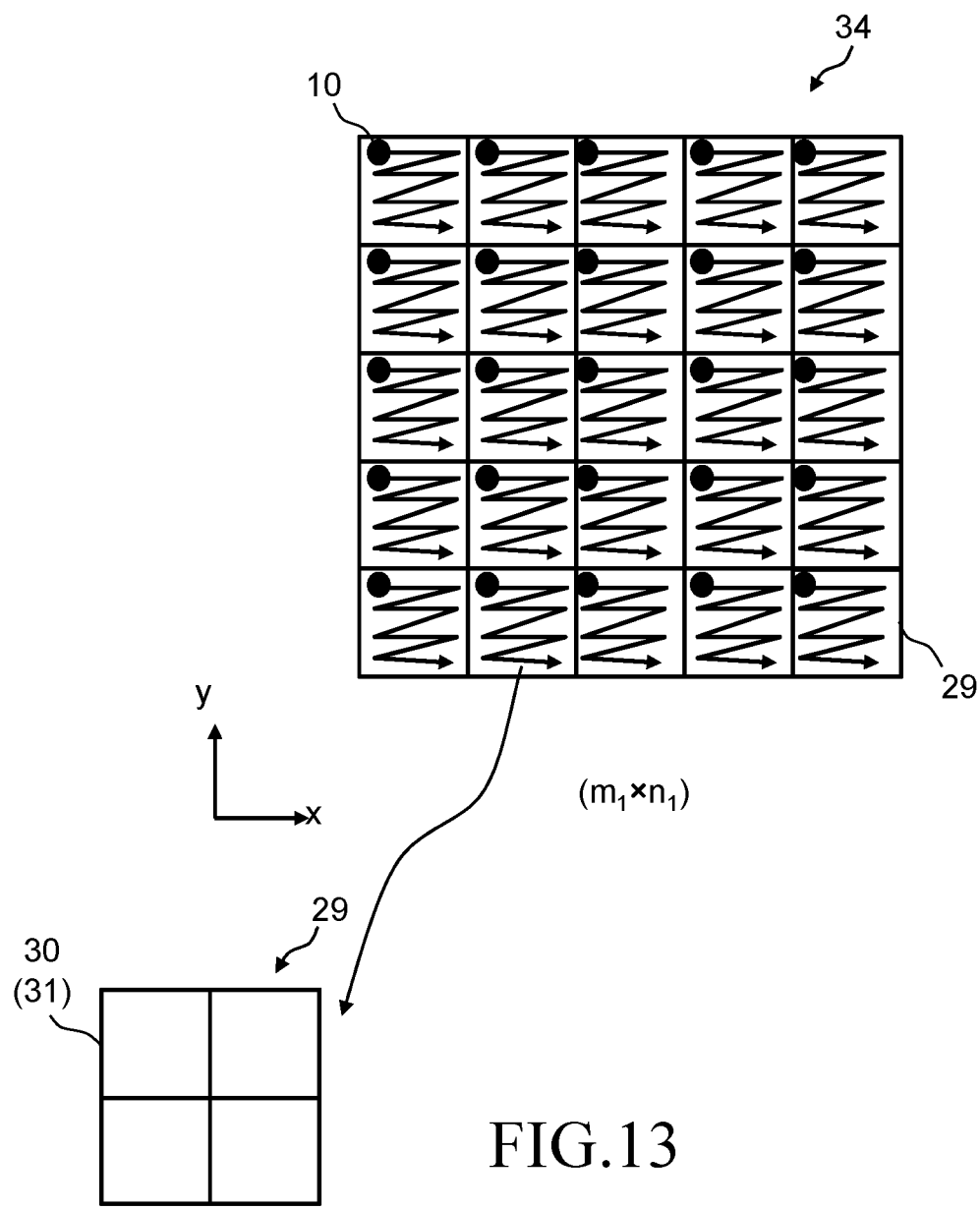
FIG. 13 illustrates scanning of multiple beams according to the first embodiment.

FIG. 13 illustrates scanning of multiple beams according to the first embodiment. FIG. 13 shows the case of the multiple primary electron beams 20 of 5×5 (5 rows by 5 columns). The size of an irradiation region 34 which can be irradiated by one irradiation with the multiple primary electron beams 20 is defined by (x direction size obtained by multiplying a beam pitch in the x direction of the multiple primary electron beams 20 on the substrate 101 by the number of beams in the x direction)×(y direction size obtained by multiplying a beam pitch in the y direction of the multiple primary electron beams 20 on the substrate 101 by the number of beams in the y direction). Each primary electron beam 10 of the multiple primary electron beams 20 scans the inside of a sub-irradiation region 29 concerned, surrounded by the beam pitch in the x direction and the beam pitch in the y direction, where the beam concerned itself is located. Each primary electron beam 10 is associated with any one of the sub-irradiation regions 29 which are different from each other. At the time of each shot, each primary electron beam 10 is applied to the same position in the associated sub-irradiation region 29. The primary electron beam 10 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 10.

The multiple secondary electron beams 300 emitted from the substrate 101 travel to the beam separator 214 through the electromagnetic lens 207.

The beam separator 214 generates an electric field and a magnetic field to be perpendicular to each other in a plane perpendicular to the traveling direction (trajectory central axis) of the center beam of the multiple primary electron beams 20. The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20.

The multiple secondary electron beams 300 bent obliquely upward and separated from the multiple primary electron beams 20 are further bent by the deflector 218, and projected, while being refracted, onto the multi-detector 222 by the electromagnetic lens 224. The multi-detector 222 detects the projected multiple secondary electron beams 300. The multi-detector 222 includes, for example, a diode type two-dimensional sensor (not shown). Then, at the position of a diode type two-dimensional sensor corresponding to each beam of the multiple primary electron beams 20, each secondary electron of the multiple secondary electron beams 300 collides with the diode type two-dimensional sensor so as to generate an electron, and secondary electron image data for each pixel. An intensity signal detected by the multi-detector 222 is output to the detection circuit 106.

When the substrate 101 is irradiated with the multiple primary electron beams 20 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20.

Similarly, when the inside of the sub-irradiation region 29 is scanned, the emission position of each secondary electron beam changes every second in the sub-irradiation region 29. The deflector 218 collectively deflects the multiple secondary electron beams 300 in order that each secondary electron beam whose emission position has changed as described above may be applied to a corresponding detection region of the multi-detector 222.

For acquiring a secondary electron image, as described above, the multiple primary electron beams 20 are applied to the substrate 101, and then, the multi-detector 222 detects the multiple secondary electron beams 300, including reflected electrons, emitted from the substrate 101 by the irradiation with the multiple primary electron beams 20. Detected data (measured image data: secondary electron image data: inspection image data) on a secondary electron of each pixel in each sub-irradiation region 29 detected by the multi-detector 222 is output to the detection circuit 106 in order of measurement. In the detection circuit 106, the detected data in analog form is converted into digital data by an A-D converter (not shown), and stored in the chip pattern memory 123. Then, the acquired secondary electron image data (data of secondary electron image 1) is output to the comparison circuit 108 together with information on each position from the position circuit 107.

Preferably, the width of each stripe region 32 described above is set to be the same as the size in the y direction of the irradiation region 34, or to be the size reduced by the width of the scanning margin. In the case of FIG. 11, the irradiation region 34 and the rectangular region 33 are of the same size. However, it is not limited thereto. The irradiation region 34 may be smaller than the rectangular region 33, or larger than it. Then, when scanning of one sub-irradiation region 29 is completed, the irradiation position is moved to an adjacent rectangular region 33 in the same stripe region 32 by collective deflection of all the multiple primary electron beams 20 by the main deflector 208. By repeating this operation, the inside of the stripe region 32 is irradiated in order. After scanning of one stripe region 32 is completed, the irradiation region 34 is moved to the next stripe region 32 by moving the stage 105 and/or by collectively deflecting all the multiple primary electron beams 20 by the main deflector 208. As described above, the scanning of each sub-irradiation region 29 and acquiring a secondary electron image are performed by the irradiation with each primary electron beam 10. A secondary electron image of the rectangular region 33, a secondary electron image of the stripe region 32, or a secondary electron image of the chip 332 is configured by combining secondary electron images of respective sub-irradiation regions 29. When an image comparison is actually performed, as shown in FIG. 13, the sub-irradiation region 29 in each rectangular region 33 is further divided into a plurality of frame regions 30, and a frame image 31 of each frame region 30 is to be compared.

Figure 14:
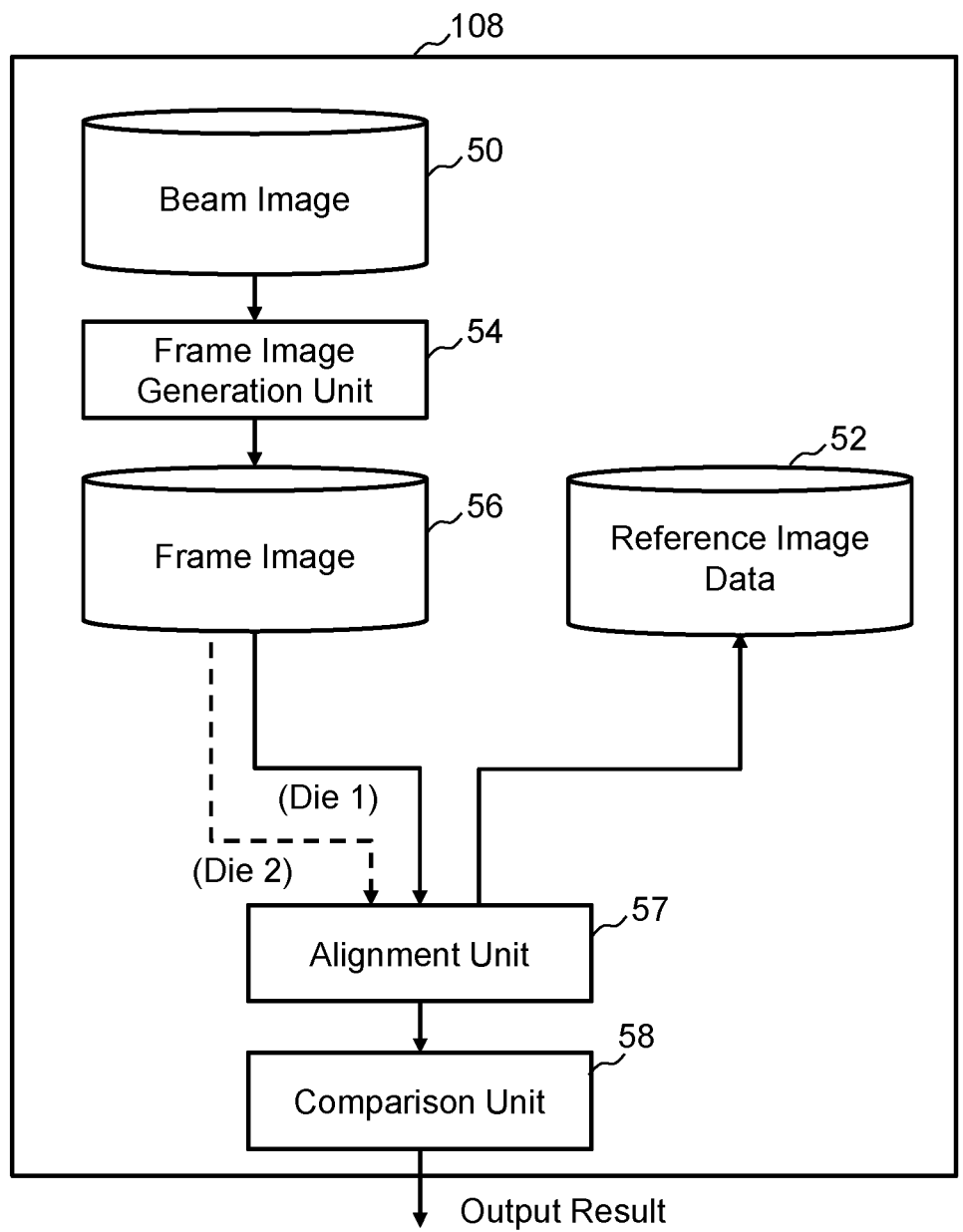
FIG. 14 shows an example of an internal configuration of a comparison circuit according to the first embodiment.

FIG. 14 shows an example of an internal configuration of a comparison circuit according to the first embodiment. In FIG. 14, in the comparison circuit 108, there are arranged storage devices 50, 52 and 56, such as magnetic disk drives, a frame image generation unit 54, an alignment unit 57, and a comparison unit 58. Each of the "units" such as the frame image generation unit 54, the alignment unit 57, and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the frame image generation unit 54, the alignment unit 57 and the comparison unit 58, and calculated results are stored in a memory (not shown) or in the memory 118 each time.

The measured image data (beam image) transmitted into the comparison circuit 108 is stored in the storage device 50.

Then, the frame image generation unit 54 generates a frame image 31 of each of a plurality of frame regions 30 obtained by further dividing image data of the sub-irradiation region 29 acquired by scanning of each primary electron beam 10. In order to prevent missing an image, it is preferable that margin regions overlap each other in each frame region 30. The generated frame image 31 is stored in the storage device 56.

In a reference image generation step, the reference image generation circuit 112 generates, for each frame region 30, a reference image corresponding to the frame image 31, based on design data serving as a basis of a plurality of figure patterns formed on the substrate 101. Specifically, it operates as follows: First, design pattern data is read from the storage device 109 through the control computer 110, and each figure pattern defined in the read design pattern data is converted into image data of binary or multiple values.

Basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data serving as figure data is input to the reference image generation circuit 112, the data is developed into data of each figure. A figure code, figure dimensions, and the like indicating the figure shape of each figure data are interpreted. Then, the reference image generation circuit 112 develops each figure data to design pattern image data of binary or multiple values as a pattern to be arranged in squares in units of grids of predetermined quantization dimensions, and outputs the developed data. In other words, the reference image generation circuit 112 reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8 (=1/256)$, the occupancy in each pixel is calculated by allocating small regions which correspond to the region of figures arranged in the pixel concerned and each of which corresponds to $1/256$ resolution. Then, the occupancy is generated as 8-bit occupancy data. The square region (inspection pixel) may be in accordance with the pixel of measured data.

Next, the reference image generation circuit 112 performs filtering processing on design image data of a design pattern which is image data of a figure, using a predetermined filter function. Thereby, it is possible to match/fit the design image data being image data on the design side, whose image intensity (gray scale level) is represented by digital values, with image generation characteristics obtained by irradiation with the multiple primary electron beams 20. The generated image data for each pixel of a reference image is output to the comparison circuit 108. The reference image data transmitted into the comparator circuit 108 is stored in the storage device 52.

Next, the alignment unit 57 reads a frame image 31 serving as an inspection image, and a reference image corresponding to the frame image 31, and provides alignment between both the images, based on units of sub-pixels smaller than units of pixels. For example, the alignment can be performed by a least-square method.

Then, the comparison unit 58 compares, for each pixel, the frame image 31 and the reference image. The comparison unit 58 compares them, for each pixel, based on predetermined determination conditions in order to determine whether there is a defect such as a shape defect. For example, if a gray scale level difference in each pixel is larger than a determination threshold Th, it is determined that there is a defect. Then, the comparison result is output. It may be output specifically to the storage device 109, the monitor 117, or the memory 118, or alternatively, output from the printer 119.

In the examples described above, the die-to-database inspection is performed. However, it is not limited thereto. A die-to-die inspection may be performed. In the case of the die-to-die inspection, alignment and comparison having been described above are carried out between the frame image 31 (die 1) to be inspected and another frame image 31 (die 2) (another example of a reference image) on which there is formed the same pattern as that of the frame image 31 to be inspected.

As mentioned above, according to the first embodiment, disturbance of the electric field at a peripheral portion of the inspection substrate 101 can be reduced by applying to each electrode 230 an individual potential obtained by adding an offset potential ΔV, which is variable according to a measured gap S, to a retarding potential Vr to be applied to the inspection substrate 101.

Conventionally, as shown in FIG. 11, it has been necessary to limit the inspection region to be within a limit line 331 so that the peripheral portion where the irradiation position deviates can be excluded. Accordingly, there has been a chip 332 which is not evaluated (inspected) because the chip cannot be used as a product, at the outside of the limit line 331 and the position overlapping with the limit line 331. In contrast, according to the first embodiment, since disturbance of the electric field at the peripheral portion of the inspection substrate 101 can be reduced, it becomes possible to correct a deviation of a beam irradiation position close to the peripheral edge of the substrate 101. Therefore, the region to be inspected can be extended up to the outside of the limit line 331 shown in FIG. 11. Thus, the unmeasurable area (region) at the peripheral portion of the substrate 101 can be reduced, thereby increasing the amount of chips having been evaluated (inspected).

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the stage control circuit 114, the lens control circuit 124, the blanking control circuit 126, the deflection control circuit 128, the camera control circuit 130, the retarding potential application circuit 170, the electrode potential application circuit 172 for applying potential to peripheral electrodes, and the offset potential calculation circuit 174 may be configured by at least one processing circuit described above. For example, processing in these circuits may be carried out by the control computer 110.

Embodiments have been explained referring to specific examples described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by irradiation with a primary electron beam from each of a plurality of irradiation sources.

While the apparatus configuration, control method, and the like not directly necessary for explaining the present invention are not described, some or all of them can be appropriately selected and used on a case-by-case basis when needed.

In addition, any other electron beam inspection apparatus and electron beam inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam inspection apparatus comprising:
    a stage configured to mount an inspection substrate thereon;
    a plurality of electrodes arranged to surround the inspection substrate;
    a camera configured to measure, for each electrode of the plurality of electrodes, a gap between a peripheral edge of the inspection substrate and an electrode of the plurality of electrodes;
    a retarding potential application circuit configured to apply a retarding potential to the inspection substrate;
    an electrode potential application circuit configured to apply, to the each electrode, a corresponding potential of potentials each obtained by adding an offset potential, which is variable according to a measured gap, to the retarding potential to be applied to the inspection substrate; and
    an electron optical system configured to irradiate the inspection substrate with an electron beam, in a state where the retarding potential has been applied to the inspection substrate and the corresponding potential of the potentials each obtained by adding the offset potential to the retarding potential has been individually applied to the each electrode of the plurality of electrodes.

2. The apparatus according to claim 1, wherein the offset potential is a negative potential.

3. The apparatus according to claim 1, wherein a peripheral edge of the each electrode of the plurality of electrodes, on a side of the inspection substrate, is formed in a shape of an arc.

4. The apparatus according to claim 1, wherein the retarding potential and the offset potential are both negative potentials.

5. The apparatus according to claim 1, further comprising:
a detector configured to detect a secondary electron emitted from the inspection substrate due to irradiation with the electron beam, in the state where the retarding potential has been applied to the inspection substrate and the corresponding potential of the potentials each obtained by adding the offset potential to the retarding potential has been individually applied to the each electrode of the plurality of electrodes.

6. An electron beam inspection method comprising:
measuring, for each electrode of a plurality of electrodes arranged to surround an inspection substrate mounted on a stage, a gap between a peripheral edge of the inspection substrate and an electrode of the plurality of electrodes;
applying a retarding potential to the inspection substrate;
applying, to the each electrode, a corresponding potential of potentials each obtained by adding an offset potential, which is variable according to a measured gap, to the retarding potential to be applied to the inspection substrate;
irradiating the inspection substrate with an electron beam, in a state where the retarding potential has been applied to the inspection substrate and the corresponding potential of the potentials each obtained by adding the offset potential to the retarding potential has been individually applied to the each electrode of the plurality of electrodes; and
comparing a measured image obtained by irradiation with the electron beam and a reference image corresponding to the measured image, and outputting a result of the comparing.

7. The method according to claim 6, wherein the offset potential is a negative potential.

8. The method according to claim 6, wherein a peripheral edge of the each electrode of the plurality of electrodes, on a side of the inspection substrate, is formed in a shape of an arc.

9. The method according to claim 6, wherein the retarding potential and the offset potential are both negative potentials.

10. The method according to claim 6, further comprising:
detecting a secondary electron emitted from the inspection substrate due to the irradiating with the electron beam, in the state where the retarding potential has been applied to the inspection substrate and the corresponding potential of the potentials each obtained by adding the offset potential to the retarding potential has been individually applied to the each electrode of the plurality of electrodes.

* * * * *